(12) United States Patent
Arp et al.

(10) Patent No.: US 10,158,351 B1
(45) Date of Patent: Dec. 18, 2018

(54) SKEW CONTROL APPARATUS AND ALGORITHM USING A LOW PASS FILTER

(71) Applicant: INTERNATIONAL BUSINESS MACHINES CORPORATION, Armonk, NY (US)

(72) Inventors: Andreas H. A. Arp, Nufringen (DE); Fatih Cilek, Boeblingen (DE); Michael V. Koch, Ehningen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/817,434

(22) Filed: Nov. 20, 2017

(51) Int. Cl.
*H03K 5/131* (2014.01)
*H03K 5/00* (2006.01)

(52) U.S. Cl.
CPC ... *H03K 5/131* (2013.01); *H03K 2005/00058* (2013.01)

(58) Field of Classification Search
None
See application file for complete search history.

(56) References Cited

U.S. PATENT DOCUMENTS

| | | | |
|---|---|---|---|
| 6,150,865 A * | 11/2000 | Fluxman | G06F 1/10 327/292 |
| 6,647,538 B1 | 11/2003 | Brown | |
| 6,900,676 B1 | 5/2005 | Tamura | |
| 7,227,921 B2 | 6/2007 | Butler et al. | |
| 8,289,063 B2 | 10/2012 | Chueh et al. | |
| 9,306,547 B2 | 4/2016 | Arp et al. | |
| 2012/0280733 A1 | 11/2012 | Zhu | |
| 2016/0134267 A1 | 5/2016 | Adachi | |

OTHER PUBLICATIONS

Geannopoulos et al., "An Adaptive Digital Deskewing Circuit for Clock Distribution Networks", ISSCC98 / Session 25 / Clock Networks / Paper SP 25.3, Feb. 7, 1998, 2 pages.

\* cited by examiner

*Primary Examiner* — Jeffrey Zweizig
(74) *Attorney, Agent, or Firm* — L. Jeffrey Kelly; Douglas M. Crockatt

(57) ABSTRACT

According to one or more embodiments, a skew control circuit for controlling the skew between at least two digital signals is provided. The skew control circuit may include a pulse generator that may generate a pulse with a pulse width, whereby the pulse width of the pulse may depend on a skew between edges of the two digital signals. The skew control circuit may also include a pulse width sensor that may output a pulse width value that represents the pulse width of the generated pulse. The skew control circuit may further include a skew controller that may adjust a delay of the at least one of the digital signals based on a target skew value and the pulse width value.

19 Claims, 7 Drawing Sheets

SKEW CONTROL APPARATUS AND ALGORITHM USING A LOW PASS FILTER

BACKGROUND

The present invention relates generally to the field of electronics and, more particularly, to skew control circuits and semiconductor devices.

A logic device may comprise several sub-circuits each having an associated clock domain. The clock domains of two sub-circuits exchanging data may be required to be in synchronization to avoid data loss and/or data faults. The sub-circuits may communicate in a hierarchical structure, wherein each sub-circuit communicates with one or more daughter sub-circuits and one mother sub-circuit (except for the root sub-circuit).

For example, a microprocessor may comprise four processor cores, whereby two of the four processor cores may exchange data via a first second level cache and the other two of the four processor cores may exchange data via a second second level cache. To allow for a data exchange between the two branches, a third level cache is provided, which communicates with the first second level cache and the second second level cache. Thus, the first second level cache has two daughter sub-circuits, namely, two of the four processor cores, and one mother sub-circuit, namely, the third level cache. The seven sub-circuits (one third level cache, two second level caches, and four processor cores) each have an associated clock domain. The clock domains are (directly or indirectly) driven by a common global clock source. However, the local clock signal of one clock domain of one sub-circuit may be early with respect to another clock-domain of a sub-circuit communicating with the aforementioned sub-circuit. The difference may also be called "skew". Delay lines may be provided between the global clock source and the local clock sources of said clock domains to ensure proper data exchange between the sub-circuits. Additionally, other timing restrictions may have to be observed to allow for parallel skew adjusting and data transmissions.

SUMMARY

Embodiments of the present invention disclose a skew control circuit. According to one embodiment, a skew control circuit for controlling the skew "between at least two digital signals is provided. The skew control circuit may include a pulse generator that may generate a pulse with a pulse width, whereby the pulse width of the pulse may depend on a skew between edges of the two digital signals. The skew control circuit may also include a pulse width sensor that may output a pulse width value that represents the pulse width of the generated pulse. The skew control circuit may further include a skew controller that may adjust a delay of the at least one of the digital signals based on a target skew value and the pulse width value.

The pulse generator may include an edge select circuit that may select either the rising edge or the falling edge of the digital signals as a selected edge based on an edge select signal, whereby the pulse width depends on the skew between the selected edges of the different digital signals.

According to another embodiment, the pulse generator comprises a XOR-gate for generating the pulse and a pulse selection circuit for selecting the pulse related to a selected edge of the digital signals.

Further, an embodiment prescribes that the pulse selection circuit comprises combinational logic circuitry, a delay element and a pass gate.

In another embodiment, the combinational logic circuitry is an AND-gate.

Further, an embodiment prescribes that the combinational logic circuitry is an OR-gate.

In another embodiment, the pulse width sensor comprises an analog low pass filter or integrator for filtering the pulse and a comparator for comparing the filtered pulse with an adjustable reference voltage.

According to an additional embodiment, the skew control circuit comprises a skew sensor arrangement for detecting the edge of which digital signal occurs earlier than the edge of the other digital signal.

Further, in an embodiment the digital signals are clock signals.

In another embodiment, the target skew value is non-zero.

According to a second aspect, a semiconductor device is proposed comprising a skew control circuit as mentioned hereinbefore.

In an embodiment, the semiconductor device is a microprocessor having multiple clock domains, and the digital signals correspond to clock signals of the clock domains.

Further, an embodiment prescribes that the semiconductor device may increase a target skew value in response to an increased frequency of the digital signals.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of the present invention relate generally to the field of electronics, and more particularly to skew control circuits. The following described exemplary embodiments provide a circuit, semiconductor device, and method to, among other things, control skew between two digital signals. As previously described, delay lines may be needed between the global clock source and the local clock sources of said clock domains to ensure proper data exchange between the sub-circuits. Additionally, other timing restrictions may have to be observed to allow for parallel skew adjusting and data transmissions. It may, therefore, be advantageous to use a skew control circuit for to optimize skew adjusting and data transmissions. Therefore, embodiments of the present invention have the capacity to improve the field of electronics by measuring the delay between two digital signals and introducing an additional delay to reduce the skew between the two signals.

Aspects of the present invention are described herein with reference to flowchart illustrations and/or block diagrams of circuits and apparatus (systems). It will be understood that each block of the flowchart illustrations and/or block diagrams, and combinations of blocks in the flowchart illustrations and/or block diagrams, can be implemented by computer readable program instructions.

Figure 1:
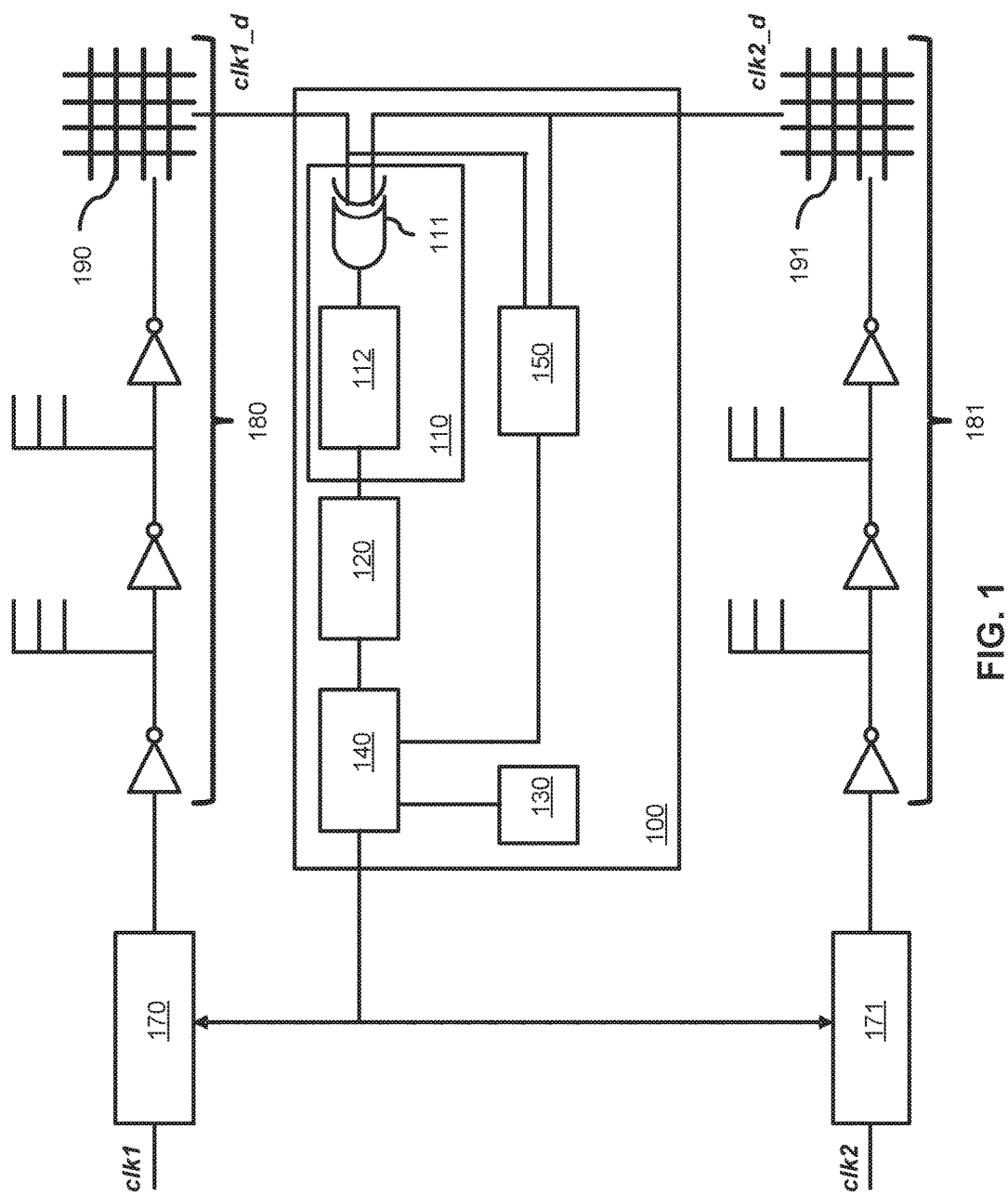
FIG. 1 shows an exemplary semiconductor device according to at least one embodiment.

Referring now to FIG. 1, an exemplary semiconductor device comprising a skew control circuit 100 is shown. The semiconductor device comprises programmable delay elements 170, 171 for intentionally delaying two signals clk1 and clk2. The signals clk1 and clk2 may be clock signals. The intentionally delayed signals are distributed to sub-circuits 180, 181 of the semiconductor device. The intentionally delayed signals may finally arrive at clock grids 190, 191. Distributing the signals to the sub-circuits 180, 181 of the semiconductor device may introduce an additional delay, respectively, as indicated with a number of inverters. The resulting digital signals after distribution may be called clk1_d and clk2_d and analyzed by a skew control circuit 100. The skew control circuit 100 may adjust the intentional delay introduced with the programmable delay elements 170, 171.

The skew control circuit 100 comprises a pulse generator 110 for generating a pulse with a pulse width, wherein the pulse width of the pulse depends on a skew between edges of the two digital signals clk1_d and clk2_d. Furthermore, the skew control circuit 100 includes a pulse width sensor 120 for outputting a pulse width value that represents the pulse width of the generated pulse. Moreover, the skew control circuit 100 comprises a skew controller 140. The skew controller 140 may be used to adjust a delay of at least one of the digital signals clk1_d and clk2_d with programmable delay elements 170, 171 based on a target skew value 130 and the pulse width value.

The pulse generator 100 may include an edge select circuit adapted for selecting either the rising edge or the falling edge of the digital signals as a selected edge based on an edge select signal. The pulse width may depend on the skew between the selected edges of the different digital signals clk1_d and clk2_d.

As indicated in FIG. 1, the pulse generator 110 may comprise a XOR-gate 111 for generating the pulse and a pulse selection circuit 112 for selecting the pulse related to a selected edge of the digital signals.

Additionally, the skew control circuit 100 may comprise a skew sensor arrangement 150 for detecting the edge of which digital signal clk1_d, clk2_d occurs earlier than the edge of the other digital signal clk2_d, clk1_d.

Figure 2:
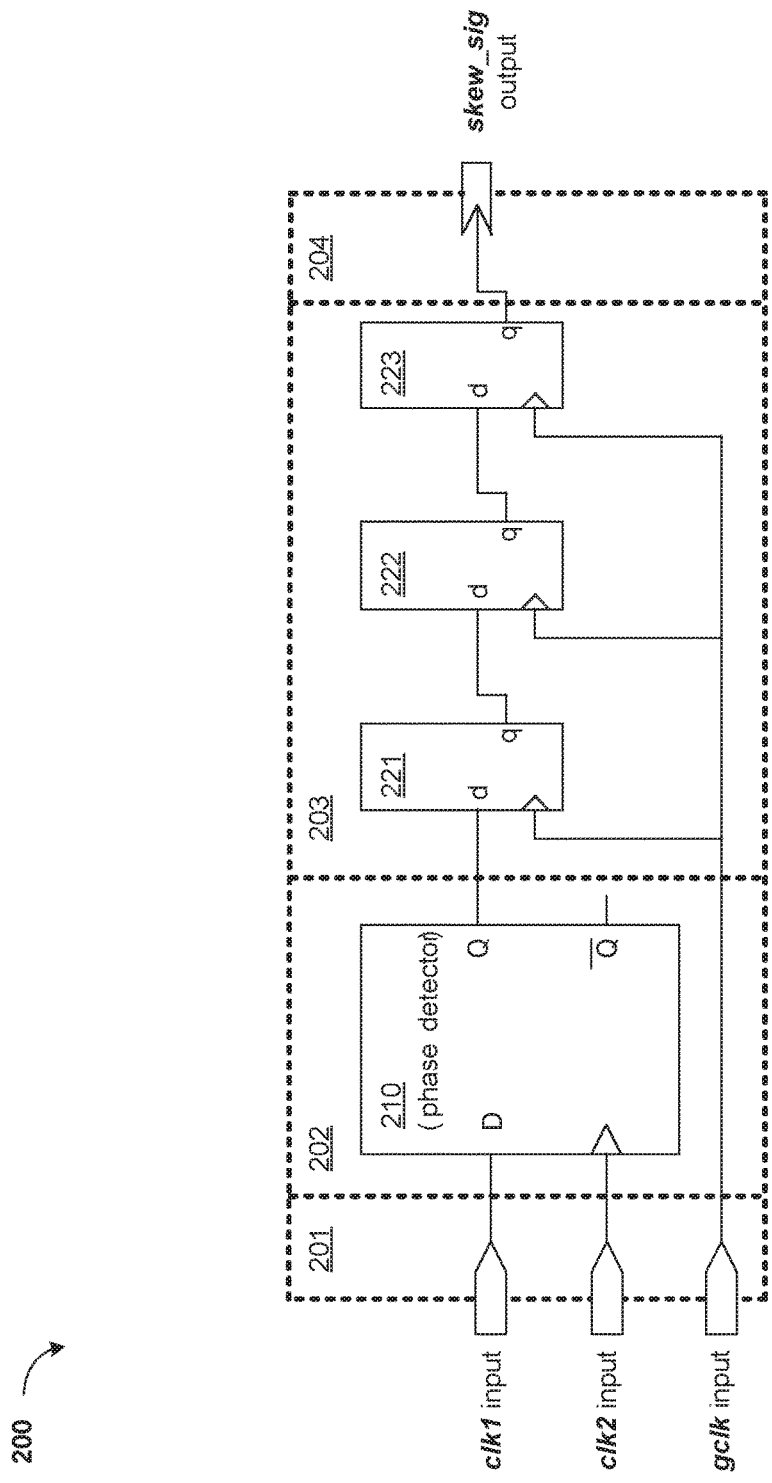
FIG. 2 shows an exemplary skew sensor arrangement according to at least one embodiment.

Referring now to FIG. 2, an exemplary skew sensor arrangement 200 according to one or more embodiments is shown. Skew sensor arrangement 200 may detect the edge of which digital signal clk1_d, clk2_d occurs earlier than the edge of the other digital signal clk2_d, clk1_d. The skew sensor arrangement 200 has an input stage 201, a phase detection stage 202, a synchronizing stage 203 and an output stage 204. The skew sensor arrangement 200 has three inputs clk1, clk2 and gclk. The phase detection stage 202 may be implemented as a D flip-flop. The output Q may be connected to a first pipeline latch 221, the output q of which may be connected to the input of a second pipeline latch 222, the output q of which may be connected to a third pipeline latch 223. The output q of the third pipeline latch 223 may be then connected to the output 204 of the skew sensor arrangement 200. The other inputs of the first, second and third pipeline latches 221, 222 and 223 are connected to a clock signal gclk. If the edges of the signals clk1 and clk2 arrive very shortly one after the other at the input D of the phase detection stage 202, it may be possible that the output Q of the phase detection stage 202 does not assume a permissible logic voltage level. For example, the voltage level at the output Q of the phase detection stage 202 may assume a voltage level corresponding to 75% of the voltage level corresponding to a logic high value. The pipeline latches 221, 222, 223 synchronized with the clock signal gclk serve to obtain a permissible logic voltage value at the output indicating whether the digital signal clk2 may be late or not.

Figures 3, 4:
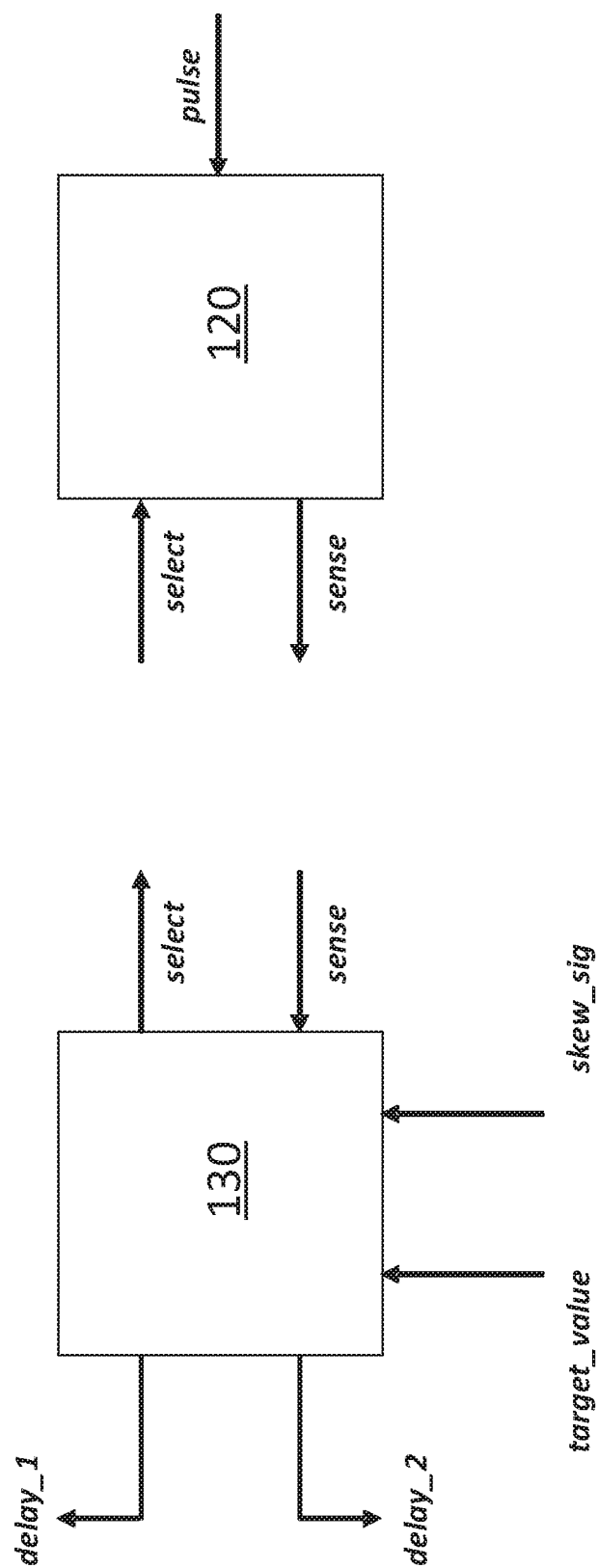
FIG. 3 shows an exemplary skew controller according to at least one embodiment.
FIG. 4 shows an exemplary pulse width sensor according to at least one embodiment.

Referring now to FIG. 3, an exemplary skew controller 130 according to one or more embodiments is shown. The skew controller 130 may receive a signal target value indicative of the target skew between two digital signals. The target skew may be provided as a signed binary representation, e.g., as an 8-bit value. The skew controller 130 may transmit a select signal to a pulse width sensor 120 which will be converted to an analog reference voltage for comparison with a pulse width value. The select signal may be a binary representation of the analog reference voltage. The skew controller 130 may receive a sense signal indicating whether the analog reference voltage or the pulse width value may be larger. In response to the sense signal, the skew controller 130 may decrease or increase the analog reference voltage via the select signal until the reference voltage essentially corresponds to the pulse width value. Then, the binary representation of the reference voltage may be indicated by the pulse width value, i.e., the current skew. The current skew may be compared with the target skew and delay signals delay_1 and delay_2 may be provided to the delay elements taking into account the clk2_is_late signal.

Referring now to FIG. 4, an exemplary pulse width sensor 120 according to one or more embodiments is shown. The pulse width sensor 120 receives a select signal from the skew controller 130 and a pulse signal and transmits the sense signal to the skew controller.

Figure 5:
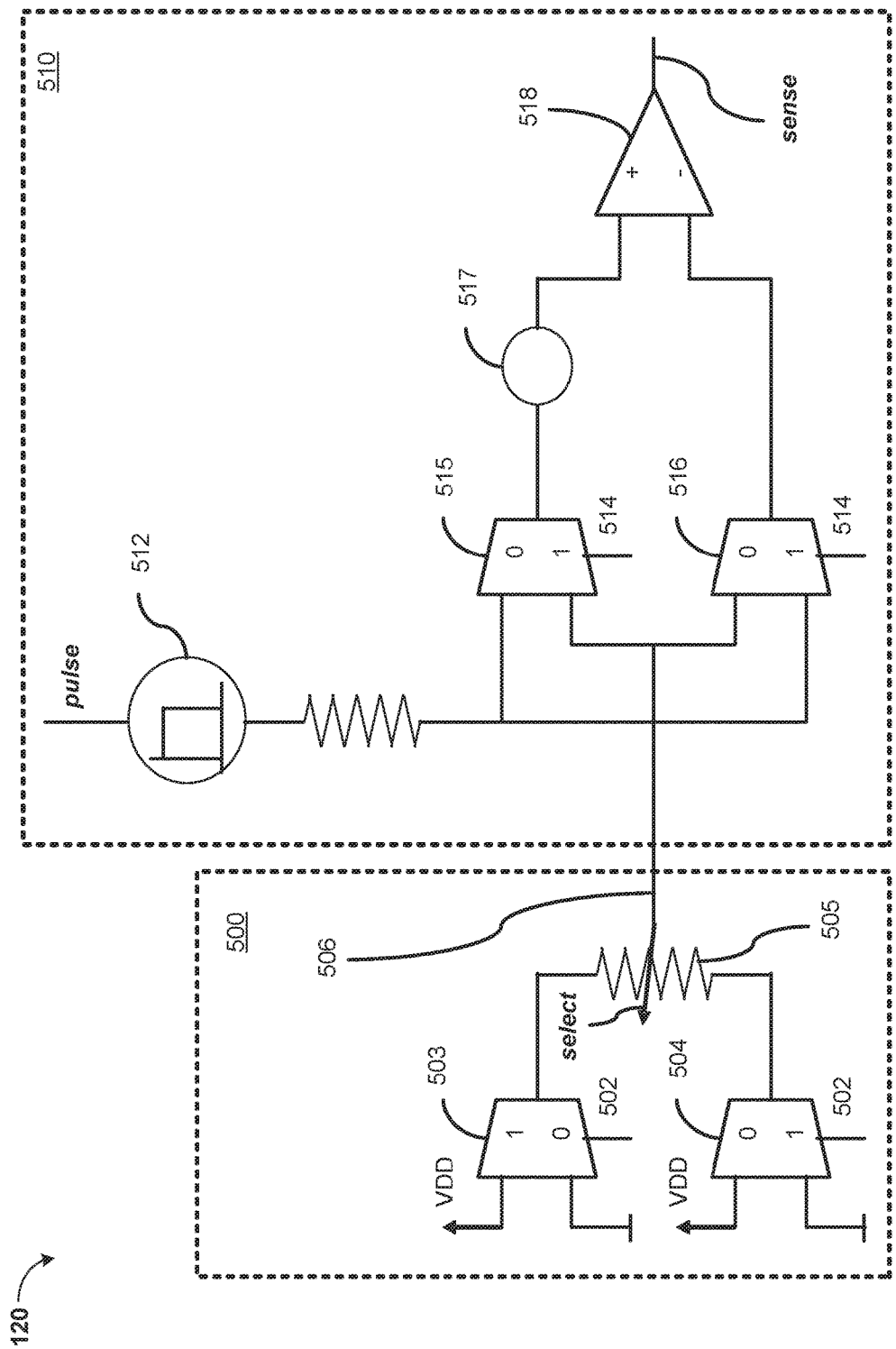
FIG. 5 shows an exemplary pulse width sensor according to at least one embodiment.

Referring now to FIG. 5, an exemplary pulse width sensor 120 according to one or more embodiments is shown. Pulse width sensor 120 may include a reference voltage generator 500 and a comparator circuit 510. A low-pass filter 512 receives a pulse and generates an analog voltage representative of the pulse width. A positive comparator MUX 515 and a negative comparator MUX 516 each receive the analog voltage representative of the pulse width and a reference voltage 506. The positive comparator MUX 515 may be connected to the positive terminal of a comparator 518 and the negative comparator MUX 516 may be connected to the negative terminal of the comparator 518. The comparator circuit 510 may have a voltage offset 517 inherent in the comparator 518, shown here for simplicity as a component connected to the positive terminal of the comparator 518. The comparator 518 evaluates the inputs of its positive and negative terminals and outputs a digital sense signal. A comparator polarity signal 514 may control both the positive comparator MUX 515 and the negative comparator MUX 516 to invert the inputs into the positive and negative terminals of the comparator 518. This inversion may be used to generate equivalent but opposite error in the comparator circuit 510, such as the voltage offset 517, so that the error may be cancelled out.

The reference voltage generator 500 generates the reference voltage 506. A select signal operates a variable resistor network 505. The variable resistor network 505 receives the outputs of a first MUX 503 and a second MUX 504. A reference polarity signal 502 operates the first MUX 503 and the second MUX 504 to invert the voltage supply and drain to each terminal of the reference voltage generator. This inversion may be used to generate equivalent but opposite error in the reference voltage generator, such as resistor variation, so that error may be cancelled out.

Figure 6A:
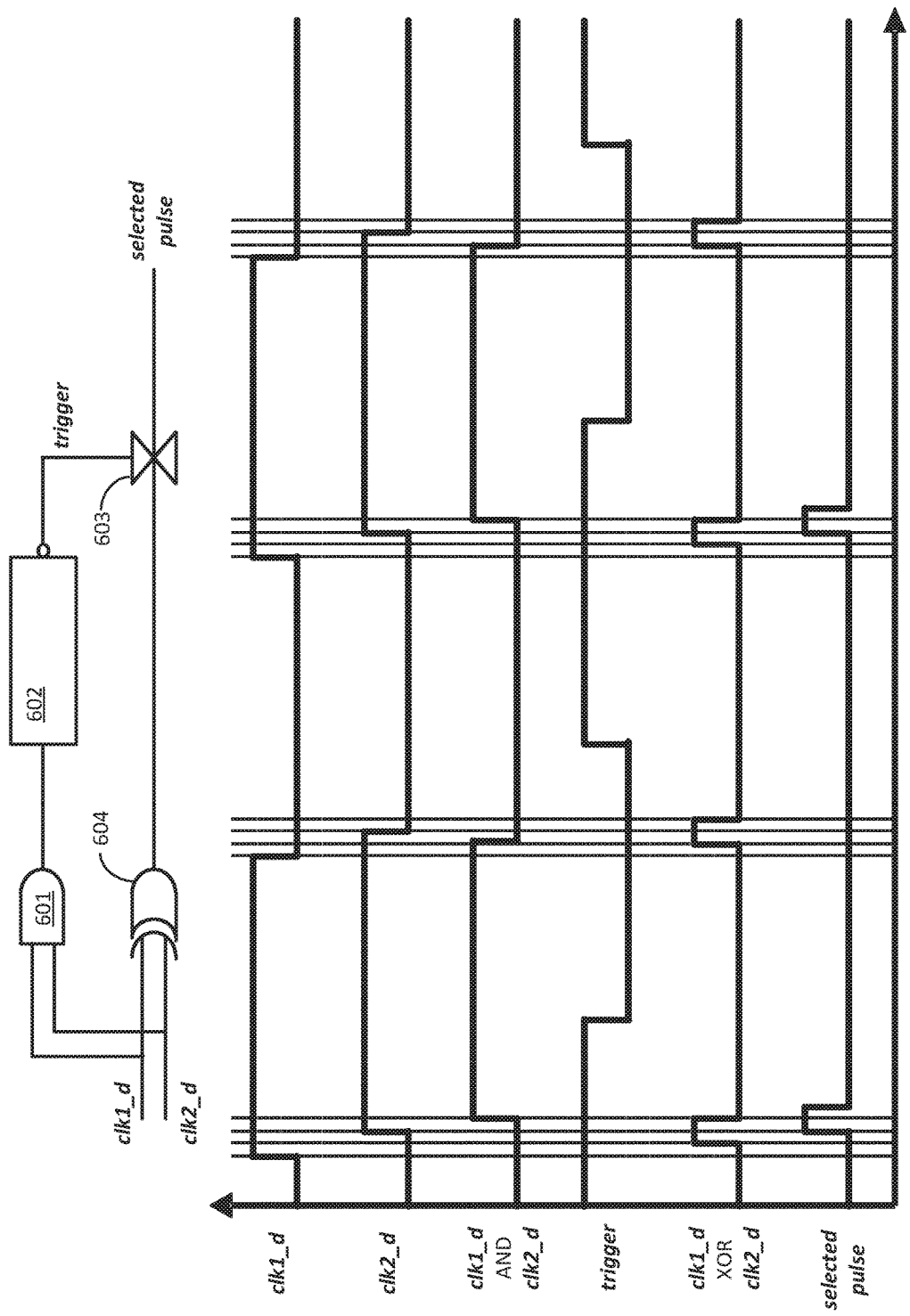
FIGS. 6A and 6B show exemplary pulse generators and corresponding timing diagrams according to at least one embodiment.

Referring now to FIG. 6A, an exemplary embodiment of a pulse generator as described hereinbefore and corresponding timing diagrams is shown. The pulse generator receives the two digital signals clk1_d and clk2_d shown in the timing diagram. A XOR-gate 604 receives the two digital signals clk1_d and clk2_d for generating pulses depending on a skew between edges of the two digital signals clk1_d and clk2_d. The signal transmitted by the XOR-gate 604 may be indicated as "clk1_d XOR clk2_d" in the timing diagram. As shown, the XOR-gate 604 generates a pulse for the rising edges of the digital signals clk1_d, clk2_d and for the falling edges of the digital signals clk1_d, clk2_d. The XOR-gate 604 introduces a slight delay. Hence, the signal clk1_d XOR clk2_d raises slightly after the digital signal clk1_d and falls slightly after the digital signal clk2_d.

An AND-gate 601 also receives the two digital signal clk1_d and clk2_d and transmits the signal clk1_d AND clk2_d to a delay element 602. A pass gate 603 receives as a trigger signal the inverted and delayed signal clk1_d AND clk2_d. As shown in the timing diagram, the AND-gate 601, delay element 602 and pass gate 603 may be considered as a pulse selection circuit, which only selects the pulse corresponding to the rising edges of the digital signals clk1_d, clk2_d from the signal clk1_d XOR clk2_d.

Figure 6B:
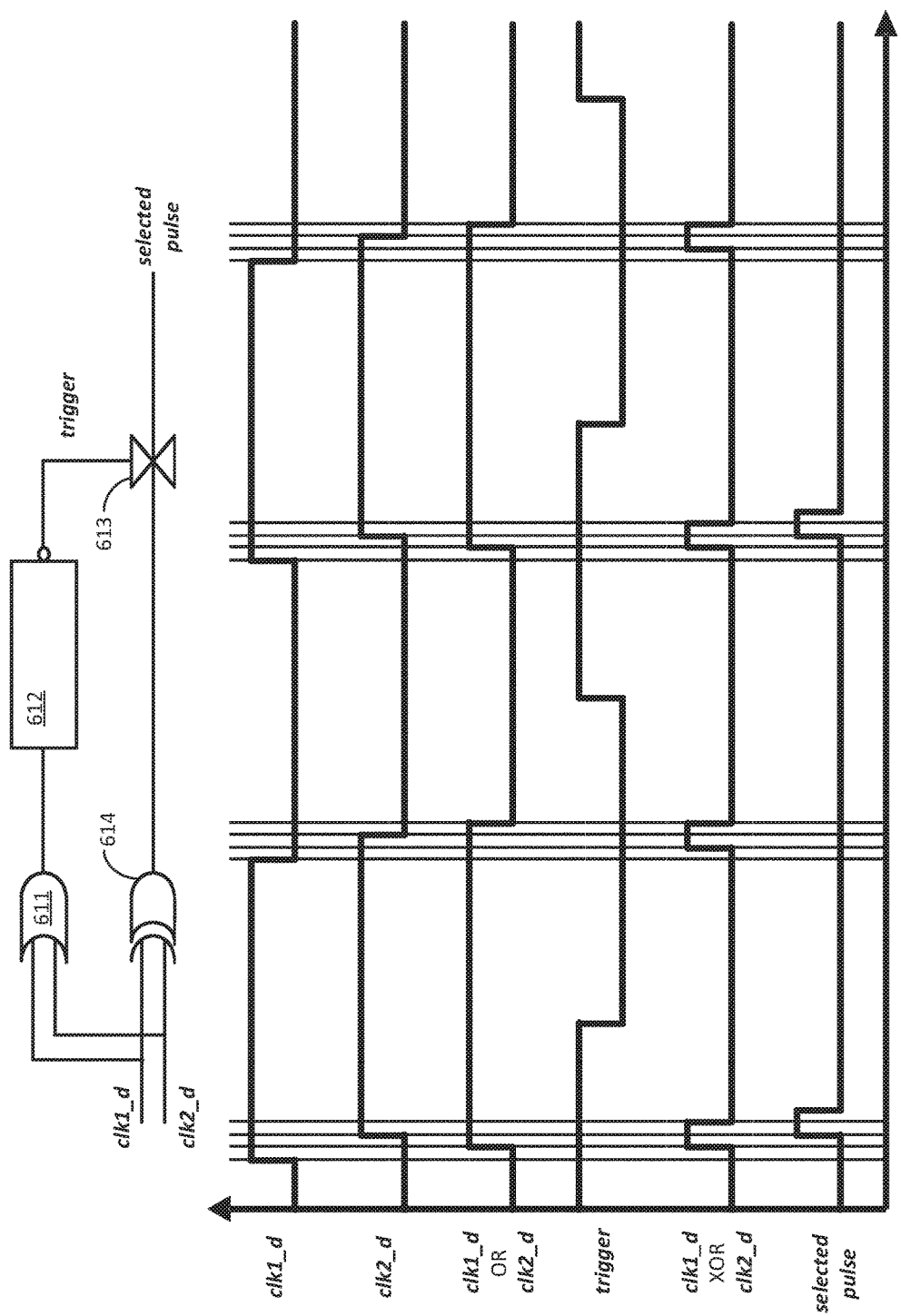

Referring now to FIG. 6b, another exemplary embodiment of a pulse generator and corresponding timing diagrams is shown. The pulse generator receives the two digital signals clk1_d and clk2_d shown in the timing diagram. A XOR-gate 614 receives the two digital signals clk1_d and clk2_d for generating pulses depending from a skew between edges of the two digital signals clk1_d and clk2_d. The signal transmitted by the XOR-gate 614 may be indicated as "clk1_d XOR clk2_d" in the timing diagram. As shown, the XOR-gate 614 generates a pulse for the rising edges of the digital signals clk1_d, clk2_d and for the falling edges of the digital signals clk1_d, clk2_d. The XOR-gate 614 introduces a slight delay. Hence, the signal clk1_d XOR clk2_d raises slightly after the digital signal clk1_d and falls slightly after the digital signal clk2_d.

An OR-gate 611 also receives the two digital signals clk1_d and clk2_d and transmits the signal clk1_d OR clk2_d to a delay element 612. A pass gate 613 receives as a trigger signal the inverted and delayed signal clk1_d OR clk2_d. As shown in the timing diagram, the OR-gate 611, delay element 612 and pass gate 613 may be considered as a pulse selection circuit, which only selects the pulse corresponding to the rising edges of the digital signals clk1_d, clk2_d from the signal clk1_d XOR clk2_d.

Figure 7:
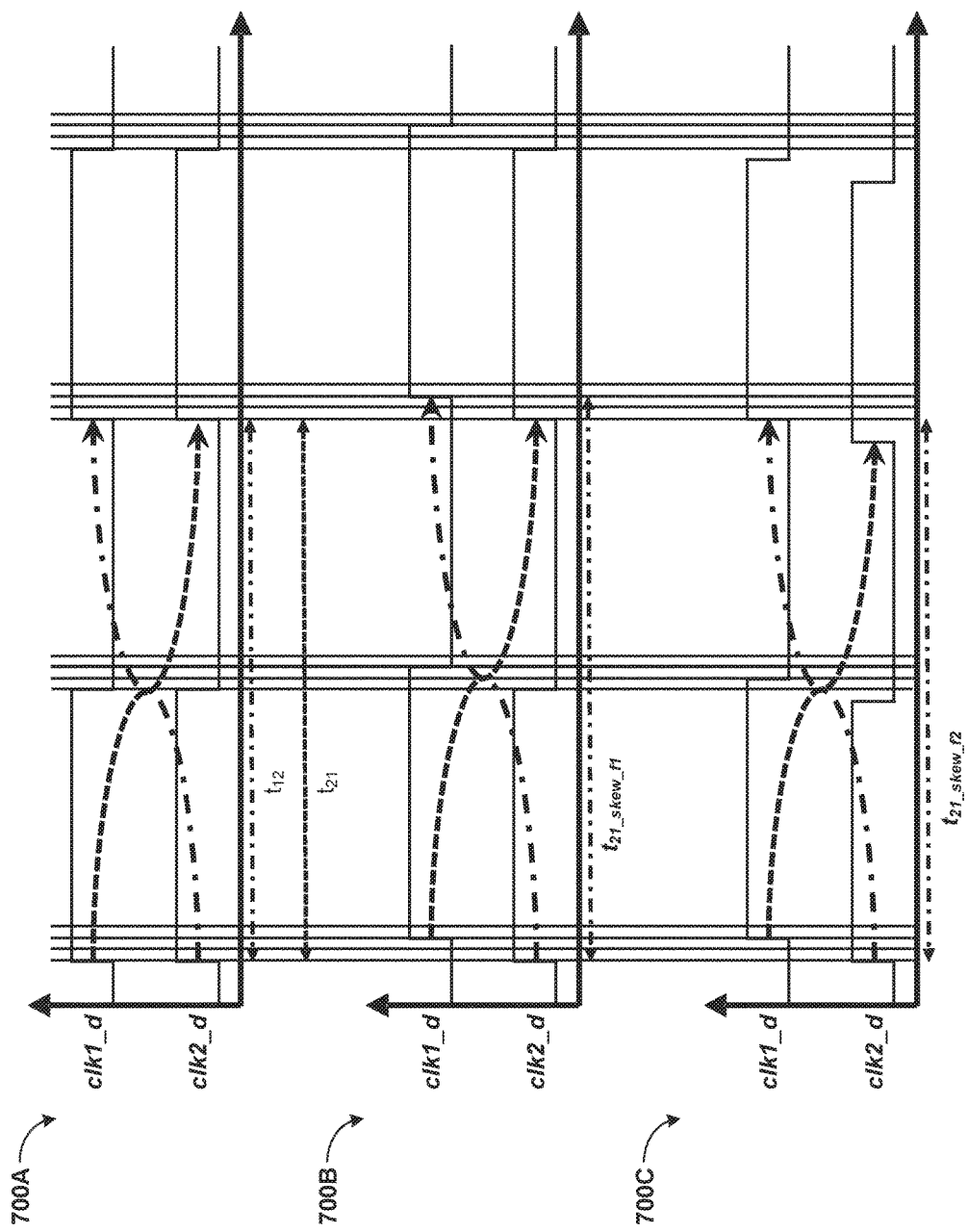
FIG. 7 show exemplary timing diagrams according to at least one embodiment.

Referring now to FIG. 7, timing diagrams for skew control circuits according to one or more exemplary embodiments is shown. According to first approach shown in timing diagram 700A, the described skew control circuit may be used for adjusting a delay of at least one of the digital signals clk1_d and clk2_d to minimize the skew between the digital signals clk1_d and clk2_d. Hence, the time window $t_{12}$ for transmitting data from a clock domain associated with the digital signal clk1_d to the clock domain associated with the digital signal clk2_d may be essentially the same as the time window $t_{21}$ for transmitting data from the clock domain associated with the digital signal clk2_d to the clock domain associated with the digital signal clk1_d. Timing Diagram 700B shows a situation, in which the described skew control circuit may be used to introduce intentionally a skew between the digital signal clk1_d and clk2_d. Thus, more time $t_{21\_skew\_f1}$ for transmitting data from a clock domain associated with the digital signal clk2_d to a clock domain associated with the digital signal clk1_d may be available. In this way, timing requirements for this communication direction can be relaxed. In another embodiment the intentional skew can allow for increasing the frequency of the digital signals clk1_d and clk2_d. As shown in timing diagram 700C, the time $t_{21\_skew\_f2}$ for transmitting data from a clock domain associated with the digital signal clk2_d to a clock domain associated with the digital signal clk1_d may be the same as the time $t_{21}$ in the example shown in FIG. 7a even if the frequency f2 of the digital signals clk1_d and clk2_d may be increased because an intentional skew may be introduced between the digital signals clk1_d and clk2_d.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit for controlling skew between at least two digital signals, the circuit comprising:
   a pulse generator, wherein the pulse generator generates a pulse having a width based on a skew value associated with an edge of each of the digital signals;
   a pulse width sensor coupled to the pulse generator, wherein the pulse width sensor measures a pulse width value corresponding to the width of the generated pulse; and
   a skew controller coupled to the pulse width sensor, wherein the skew controller introduces a delay to at least one of the digital signals based on a target skew value and the measured pulse width value.

2. The circuit of claim 1, wherein the pulse generator comprises an edge select circuit, the edge select circuit selecting one or more of a rising edge and a falling edge as a selected edge for each of the digital signals based on an edge select signal, and wherein the pulse width depends on the skew between the selected edges of the different digital signals.

3. The circuit of claim 1, wherein the pulse generator comprises:
   an XOR gate, wherein the XOR gate generates the pulse; and
   a pulse selection circuit, wherein the pulse selection circuit selects the pulse related to a selected edge of the digital signals.

4. The circuit of claim 3, wherein the pulse selection circuit comprises a combinational logic circuit, a delay element, and a pass gate.

5. The circuit of claim 4, wherein the combinational logic circuit comprises an AND gate.

6. The circuit of claim 4, wherein the combinational logic circuit comprises an OR gate.

7. The circuit of claim 1, wherein the pulse width sensor comprises:
   an integrator, wherein the integrator filters the pulse; and
   a comparator, wherein the comparator compares the filtered pulse with an adjustable reference voltage.

8. The circuit of claim 1, wherein the skew control circuit comprises one or more skew sensors, the one or more skew sensors detecting an edge associated with one of the digital signals occurring earlier than an edge associated with one or more of the other digital signals.

9. The circuit of claim 1, wherein the digital signals comprise clock signals.

10. The circuit of claim 1, wherein the target skew value is non-zero.

11. A semiconductor device for controlling skew between at least two digital signals, the semiconductor device comprising:
    a pulse generator, wherein the pulse generator generates a pulse having a width based on a skew value associated with an edge of each of the digital signals;
    a pulse width sensor coupled to the pulse generator, wherein the pulse width sensor measures a pulse width value corresponding to the width of the generated pulse; and
    a skew controller coupled to the pulse width sensor, wherein the skew controller introduces a delay to at least one of the digital signals based on a target skew value and the measured pulse width value.

12. The semiconductor device of claim 11, wherein the semiconductor device comprises a microprocessor having one or more clock domains, and wherein the digital signals correspond to one or more clock signals associated with the clock domains.

13. The semiconductor device of claim 11, wherein the semiconductor device increases a target skew value in response to an increased frequency of the digital signals.

14. The semiconductor device of claim 11, wherein the pulse generator comprises an edge select circuit, the edge select circuit selecting one or more of a rising edge and a falling edge as a selected edge for each of the digital signals based on an edge select signal, and wherein the pulse width depends on the skew between the selected edges of the different digital signals.

15. The semiconductor device of claim 11, wherein the pulse generator comprises:
    an XOR gate, wherein the XOR gate generates the pulse; and
    a pulse selection circuit, wherein the pulse selection circuit selects the pulse related to a selected edge of the digital signals.

16. The semiconductor device of claim 15, wherein the pulse selection circuit comprises a combinational logic circuit, a delay element, and a pass gate.

17. The semiconductor device of claim 11, wherein the pulse width sensor comprises:
    an integrator, wherein the integrator filters the pulse; and
    a comparator, wherein the comparator compares the filtered pulse with an adjustable reference voltage.

18. A method for controlling skew between at least two digital signals, the method comprising:
    generating a pulse having a width based on a skew value associated with an edge of each of the digital signals;
    measuring a pulse width value corresponding to the width of the generated pulse; and
    introducing a delay to at least one of the digital signals based on a target skew value and the measured pulse width value.

19. The method of claim 18, wherein generating of the pulse comprises:
    receiving an edge select signal;
    selecting one or more of a rising edge and a falling edge as a selected edge for each of the digital signals in response to the received edge select signal; and
    generating the pulse having the width based on the skew between the selected edges of the different digital signals.

* * * * *